United States Patent [19]
Barbu et al.

[11] Patent Number: 5,278,795
[45] Date of Patent: Jan. 11, 1994

[54] MEMORY CIRCUIT HAVING A LINE DECODER WITH A DARLINGTON-TYPE SWITCHING STAGE AND A DISCHARGE CURRENT SOURCE

[75] Inventors: Stephane Barbu, Caen; Guy Imbert, Hermanville/Mer, both of France

[73] Assignee: U.S. Philips Corporation, New York, N.Y.

[21] Appl. No.: 47,334

[22] Filed: Aug. 16, 1990

Related U.S. Application Data

[63] Continuation of Ser. No. 462,273, Dec. 22, 1989, abandoned, which is a continuation of Ser. No. 171,725, Mar. 22, 1988, abandoned.

[30] Foreign Application Priority Data

Mar. 27, 1987 [FR] France .................. 87 04301

[51] Int. Cl.$^5$ .................................................. G11C 7/00
[52] U.S. Cl. .......................... 365/204; 365/230.06; 365/190
[58] Field of Search .............. 365/204, 155, 179, 174, 365/190, 230.06

[56] References Cited

U.S. PATENT DOCUMENTS

| | | | |
|---|---|---|---|
| 4,156,941 | 5/1979 | Homma et al. | 365/189 X |
| 4,168,490 | 9/1979 | Stinehelfer | 365/204 X |
| 4,168,539 | 9/1979 | Anderson | 365/155 X |
| 4,369,502 | 1/1983 | Isogai | 365/190 X |
| 4,393,476 | 7/1983 | Ong | 365/203 |
| 4,520,462 | 5/1985 | Yamada et al. | 365/203 X |
| 4,539,659 | 9/1985 | Dumont | 365/226 |
| 4,570,240 | 2/1986 | Seelbach et al. | 365/155 |
| 4,601,014 | 7/1986 | Kitano et al. | 365/190 X |
| 4,611,303 | 9/1986 | Kitano | 365/179 X |
| 4,618,944 | 10/1986 | Okajima | 365/190 X |
| 4,706,222 | 11/1987 | Kwiatkowski et al. | 365/241 X |

*Primary Examiner*—Andrew L. Sniezek
*Attorney, Agent, or Firm*—Steven R. Biren

[57] ABSTRACT

The invention relates to a memory having a line decoder provided with a Darlington-type switching stage. When the deselection time $T_1$ of a line is notably shorter than the intrinsic switching time $T_3$ of a memory cell ($M_{11} \ldots M_{np}$), a discharge current $I_D$ is temporarily applied to the lower line conductor ($1' \ldots n'$) of the line ($L_1 \ldots L_n$) which is deselected. To achieve this, the current source $I_D$ is connected to said lower line conductors ($1' \ldots n'$) via delay circuits ($RL_1, DL_1 \ldots RL_n, DL_n$) having a time constant $T_2$ which is smaller than $T_3$ and at least equal to $T_1$.

4 Claims, 1 Drawing Sheet

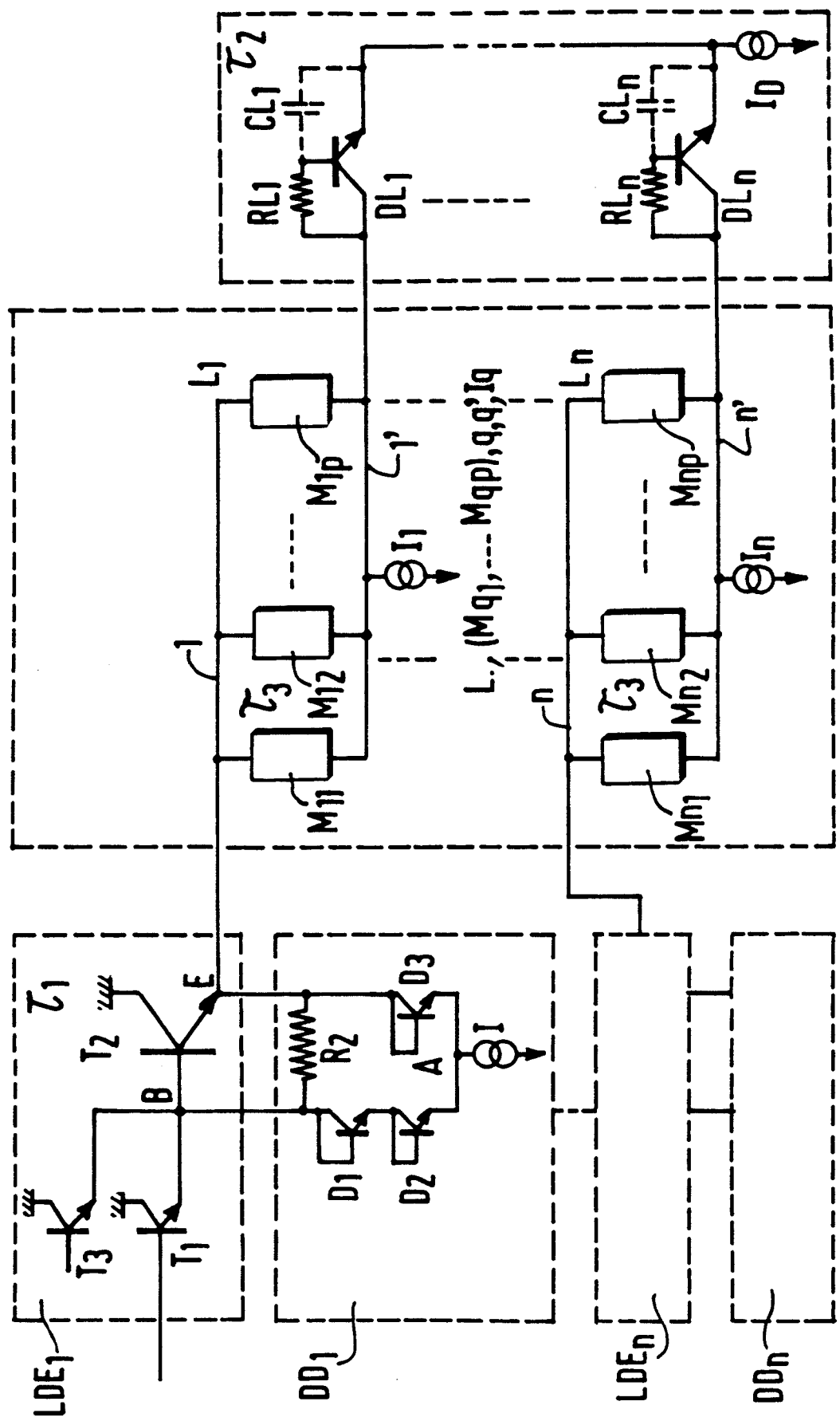

MEMORY CIRCUIT HAVING A LINE DECODER WITH A DARLINGTON-TYPE SWITCHING STAGE AND A DISCHARGE CURRENT SOURCE

This is a continuation of application Ser.No. 462,273, filed Dec. 22, 1989 which is a continuation of Ser. No. 171,725 filed on Mar. 22, 1988, both now abandoned.

BACKGROUND OF THE INVENTION

The invention relates to a memory having a line decoder which comprises for each line a Darlington-type line switching stage, comprising a first transistor whose base forms the input of the stage and serves to receive a logic control signal whose voltage varies between a level which is referred to as the selection level and a level which is referred to as the non-selection level, its emitter being connected to the base of a second transistor whose emitter constitutes the output of the stage and is connected to an upper line conductor in which a first current flows when said logic control signal has the selection level, while a second current which is smaller than the first current flows therein when said logic control signal has the non-selection level. In this stage there are arranged, between the base of the second transistor and an auxiliary current source for a current intensity between that of the second current and the first current, a first and a second diode which are connected in series and in the forward direction and which form a first branch. In this stage there is also arranged, between the emitter of the second transistor and said auxiliary current source, a third diode which is connected in the forward direction and which constitutes a second branch so that, when the control signal of a said line is switched between its selection level and its non-selection level, the charges stored in the base of the second transistor are drained by the current of the auxiliary current source, the major part of which enters the first branch.

A memory of this kind is described in French Patent Application No. 85 05 702, filed on Apr. 16, 1986, and entitled "Etage de commutation de type Darlington notamment pour un decodeur de lignes d'une memoire". The corresponding U.S. Pat. No. 4,706,222. The memories essentially covered by said Application are essentially fast memories comprising a reduced number of lines.

However, it may also be advantageous to realize a Darlington-type switching stage as described for other types of memory, having a longer switching time, in order to improve the deselection of the lines and to achieve also the supplementary advantage of a greater gap between the level corresponding to the selected mode and the level corresponding to the non-selected mode.

It has been found that in given cases dysfunctioning could occur at the level of the deselected lines of an active charge memory (ECL) or resistive charge memory.

Such dysfunctioning consists in the inverse saturation of a transistor of a half-cell of each cell of the deselected line or lines. This phenomenon is particularly disturbing, because if the desaturation of the pnp transistor of an ECL half-cell is particularly slow in the normal saturation mode, that is to say direct, desaturation will even be slower in the inverse saturation mode. It is, moreover, a paradox in that the improvement of the deselection speed of the lines of a memory is always considered to be advantageous. In the case of a resistive charged memory, the inversion of the pnp transistor of a half-cell also constitutes a drawback.

The cause of such dysfunctioning has been determined to be due to the fact that when the cell has an intrinsic switching time constant which is notably longer than the deselection time constant of the lines, the level of its upper line conductor may be temporarily lower than the internal high level of the memory cell and, in given cases, even lower than the level of its lower line conductor; in the first case this causes the pnp transistor of an ECL half-cell to enter the inverse saturation mode, and in the second case a complete half-cell to enter the direct inverse mode.

SUMMARY OF THE INVENTION

It is the object of the invention to mitigate this drawback and to maintain at the same time the advantage of a high deselection speed for the selected line.

To achieve this, the memory is characterized in that it comprises a discharge current source which is connected to the lower line conductors via, for each line, a delay circuit whose time constant is smaller than the intrinsic switching time of a memory cell and at least equal to the deselection time constant of an upper line conductor.

When a line is deselected, the current supplied by the discharge current source temporarily continues, due to the delay introduced, to flow via the line conductors of the deselected line. This increases the switching speed of the memory cells.

In a preferred embodiment, the time constant of the delay circuit is chosen so that the apparent switching time of a memory cell is minimized.

A delay circuit of this kind is preferably formed by a so-called line transistor which is connected as a diode by bridging its base and its collector by means of a line resistor, the collector of said line transistor being connected to the lower line conductor of the corresponding line, the emitters of the line transistors being connected to said discharge current source.

BRIEF DESCRIPTION OF THE DRAWING

The invention will be better understood on the basis of the following description, given by way of a non-limitative example, with reference to the sole FIGURE, which shows an embodiment of a memory in accordance with the invention of the emitter coupled logic and active charge type (ECL).

DESCRIPTION OF THE PREFERRED EMBODIMENTS

Each memory line (L1 . . . Ln) comprises a line switching stage (LDE1 . . . LDEn) connected thereto. With each line switching stage there is associated a dynamic discharge circuit (DD1 . . . DDn) which enables acceleration of the deselection of a line.

The input of each line switching stage (LDE . . . LDEn) is formed by the base of the transistor $T_1$. When the line is selected, the base of the corresponding transistor $T_1$ carries ground potential, while it carries a given negative potential when the line is non-selected (low level).

Each transistor $T_1$ is connected to the base of an output transistor $T_2$ which is large in comparison with $T_1$ and whose collector is connected to ground while its emitter is connected to the corresponding upper line conductor (1, . . . n).

When the line Lq is selected, that one of the memories (Mq1 ... Mqp) which itself is selected by column conductors (not shown) is traversed by a comparatively large selection current $I_S$, the other cells being traversed by a sustain current which is supplied by a current source Iq connected to the lower line conductor q'.

For the other, non-selected lines, the cells are traversed only by the sustain current supplied by suitable current sources ($I_1 ... I-q_1, Iq_{11} ... In$) (for example, 300 mA each) which are connected to the corresponding lower line conductors ($1' ... q'-1, q' ... n'$).

When the line Lq is deselected, the current of the transistor T2 drops from Is to Iq.

This current drop is accelerated by the associated dynamic discharge circuit DDq. This circuit comprises a current source I which is connected to a point A. Let B be the base of the transistor $T_2$ and E its emitter. Between the points B and A there are connected, in the forward direction, two diodes $D_1$ and $D_2$ which form a first branch, and between the points E and A there is connected a diode $D_3$ also in the forward direction, which forms a second branch. When the line is deselected, the charges stored in the base of the transistor $T_2$ are drained by the current I, the major part of which enters the first branch.

In the non-selected mode, the major part of the current I enters the second branch.

For a more detailed description of the operation of this dynamic discharge circuit, reference is made to the earlier-cited Patent Application.

Thus, as has already been mentioned, when the intrinsic switching time $T_3$ of a memory cell ($M_{11} ... M_{np}$) is notably greater than the deselection time $T_1$ of a line, the level of its upper line conductor may temporarily be lower than the internal high level of a memory cell, so that the pnp transistor of an ECL half-cell enters the inverse saturation state.

In given cases, the level of the upper line conductor may become lower than the level of the lower line conductor, with the result that a half-cell operates in the direct inverse mode.

The basic idea of the invention consists in the temporary supply of a discharge current $I_D$ to the lower line conductor q' of the deselected line Lq in order to accelerate the switching of the cells.

To achieve this, a current source $I_D$ is connected to each of the lower line conductors ($1' ... n'$) via a delay circuit (DL1 ... DLn).

As appears from the FIGURE, a delay circuit comprises a transistor which is connected as a diode (DL1 ... DLn) by bridging its base and its collector by means of a resistor (RL1 ... RLn).

The time constant $T_2$ of this circuit is the product of the corresponding resistance (RL1 ... RLn) and the capacitance $C_{BE}$ of the corresponding transistor (DL1 ... DLn). This time constant $T_2$ can be increased, if necessary, by adding a supplementary capacitance (CL1 ... CLn) between the base and the emitter of the corresponding transistor (DL1 ... DLn).

When the line Lq is selected, its lower line conductor q' is at a level which exceeds that of the other lower line conductors and the current $I_D$ is added to the current Iq. When the line Lq is deselected, the contribution of the current $I_D$ to the line Lq is temporarilly sustained because of the time constant $T_2$ introduced.

The time constant $T_2$ of the delay circuits must be chosen so as to be smaller than the intrinsic switching time constant $T_3$ of the memory cells ($M_{11} ... M_{np}$). This time $T_3$ is defined as the switching time of said cells in the absence of the delay circuits.

The time constant $T_3$ must also be chosen so as to be greater than or equal to the time constant $T_1$ for the deselection of the lines.

When a line is deselected, the discharge current $I_D$ is temporarilly added to the current flowing through the cells in order to accelerate their switching.

As a result, the apparent switching time $T_3'$ of the cells becomes smaller than the intrinsic time $T_3$ defined above. This improvement of the dynamic performance of the cells serves to prevent the cells being set to the inverse saturation mode of the inverse direct mode.

The time constant $T_2$ is preferably chosen so that the time $T_3'$ is minimized. It can be demonstrated that the function linking $T_3'$ to $T_2$ passes through a minimum and that, consequently, a reduction of $T_2$ therebeyond does not offer further improvement.

The valve of the current $I_D$ will be chosen so that the writing speed for the cell is not excessively decreased.

EXAMPLE $T_1 = 0.4$ ns $T_2 = 0.5$ ns
$T_3 = 1.3$ ns $T_3' = 0.9$ ns
with $I_D = 1$ mA
and $I1, ..., In = 300$ μA.

What is claimed is:

1. A memory, comprising a plurality of lines and a line decoder which comprises for each of said plurality of lines a Darlington-type line switching stage, comprising a first transistor whose base forms the input of the stage and serves to receive a logic control signal whose voltage varies between a level which is referred to as selection level and a level which is referred to as non-selection level, and a second transistor, the emitter of the first transistor being connected to the base of the second transistor whose emitter constitutes the output of the stage and is connected to an upper line conductor of said plurality of lines in which a first current flows when said logic control signal is at the selection level while a second current which is smaller than the first current flows therein when said logic control signal is at the non-selection level, in which stage there are arranged, between the base of the second transistor and an auxiliary current source for providing a current intensity between that of the second current and the first current, a first and a second diode which are connected in series and in the forward direction and which form a first branch, and in which stage there is also arranged, between the emitter of the second transistor and said auxiliary current source, a third diode which is connected in the forward direction and which constitutes a second branch so that, when the control signal of said line associated with said Darlington-type line switching stage is switched between its selection level and its non-selection level, charges stored in the base of the second transistor are drained by the current of the auxiliary current source, the major part of which enters the first branch, said plurality of lines of the memory having a lower line conductor connected to a sustain current source, characterized in that said current source comprises a discharge current source which is connected only to the lower line conductors via, for each lower line conductor, a delay circuit whose time constant is smaller than an intrinsic switching time of a memory cell and at least equal to a deselection time constant of an upper line conductor.

2. A memory as claimed in claim 1, characterized in that the time constant of said delay circuit is chosen so that the switching time of a memory cell is minimized.

3. A memory as claimed in claim 2, characterized in that said delay circuit is formed by a line transistor which is connected as a diode by bridging its base at its collector by means of a line resistor, the collector of said line transistor being connected to a lower line conductor of the corresponding line, the emitters of the line transistors being connected to said discharge current source.

4. A memory as claimed in claim 3, characterized in that each of said line transistors comprises a capacitor which is connected between its base and its emitter.

* * * * *